(12) United States Patent
Thompson et al.

(10) Patent No.: US 11,101,418 B1
(45) Date of Patent: Aug. 24, 2021

(54) SPACER FOR SELF-ALIGNED MESA

(71) Applicant: Facebook Technologies, LLC, Menlo Park, CA (US)

(72) Inventors: Daniel Bryce Thompson, Cork (IE); James Small, Langbank (GB)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 54 days.

(21) Appl. No.: 16/566,750

(22) Filed: Sep. 10, 2019

(51) Int. Cl.
  *H01L 33/20* (2010.01)
  *H01L 33/62* (2010.01)
  *H01L 33/00* (2010.01)
  *H01L 33/10* (2010.01)
  *H01L 33/46* (2010.01)
  *H01L 33/30* (2010.01)
  *H01L 33/60* (2010.01)

(52) U.S. Cl.
  CPC .......... *H01L 33/62* (2013.01); *H01L 33/0075* (2013.01); *H01L 33/10* (2013.01); *H01L 33/30* (2013.01); *H01L 33/46* (2013.01); *H01L 33/60* (2013.01)

(58) Field of Classification Search
  CPC ......... H01L 33/20; H01L 33/54; H01L 33/58; H01L 33/60; H01L 33/387
  See application file for complete search history.

(56) References Cited

U.S. PATENT DOCUMENTS

| | | | |
|---|---|---|---|
| 1,076,338 | A1 | 9/2020 | Thompson et al. |
| 2008/0217635 | A1 | 9/2008 | Emerson et al. |
| 2015/0099317 | A1* | 4/2015 | Hayakawa ............. H01S 5/423 |
| | | | 438/27 |

OTHER PUBLICATIONS

Notice of Allowance dated May 8, 2020 in U.S. Appl. No. 16/437,567.

* cited by examiner

*Primary Examiner* — Hoai V Pham
(74) *Attorney, Agent, or Firm* — Weaver Austin Villeneuve & Sampson LLP

(57) ABSTRACT

Described are light emitting apparatus with self-aligned elements and techniques for manufacturing such light emitting apparatus. In certain embodiments, a light emitting apparatus includes a mesa formed by a plurality of semiconductor layers. The light emitting apparatus further includes an electrical contact on one of the semiconductor layers and a spacer around the electrical contact. The spacer is aligned with respect to the electrical contact, which permits etching around the spacer to define the shape of the mesa in such a way that the mesa is also aligned with respect to the electrical contact. In particular, the electrical contact is substantially centered between opposing sidewalls of the mesa.

16 Claims, 7 Drawing Sheets

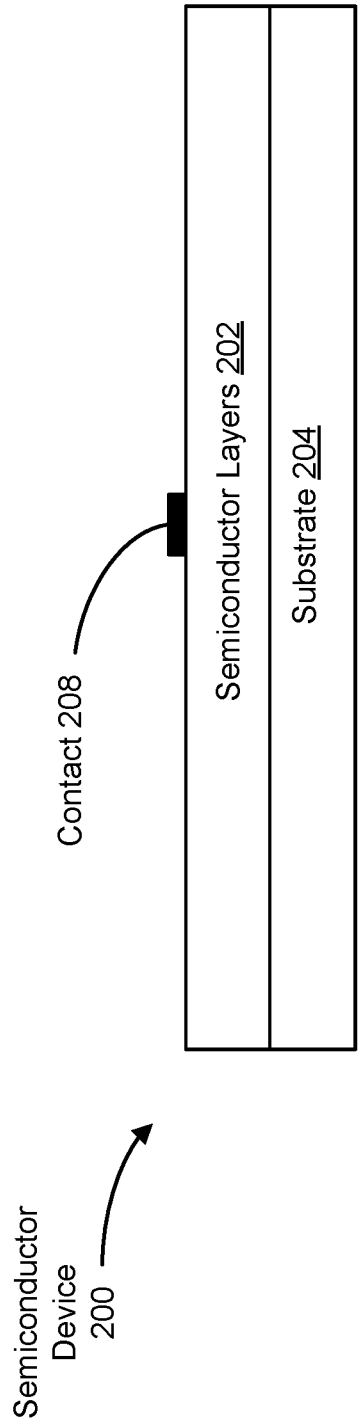
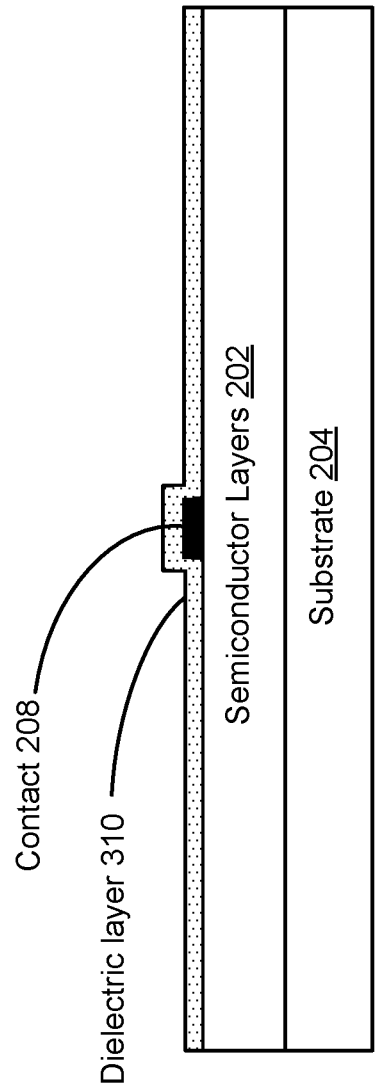

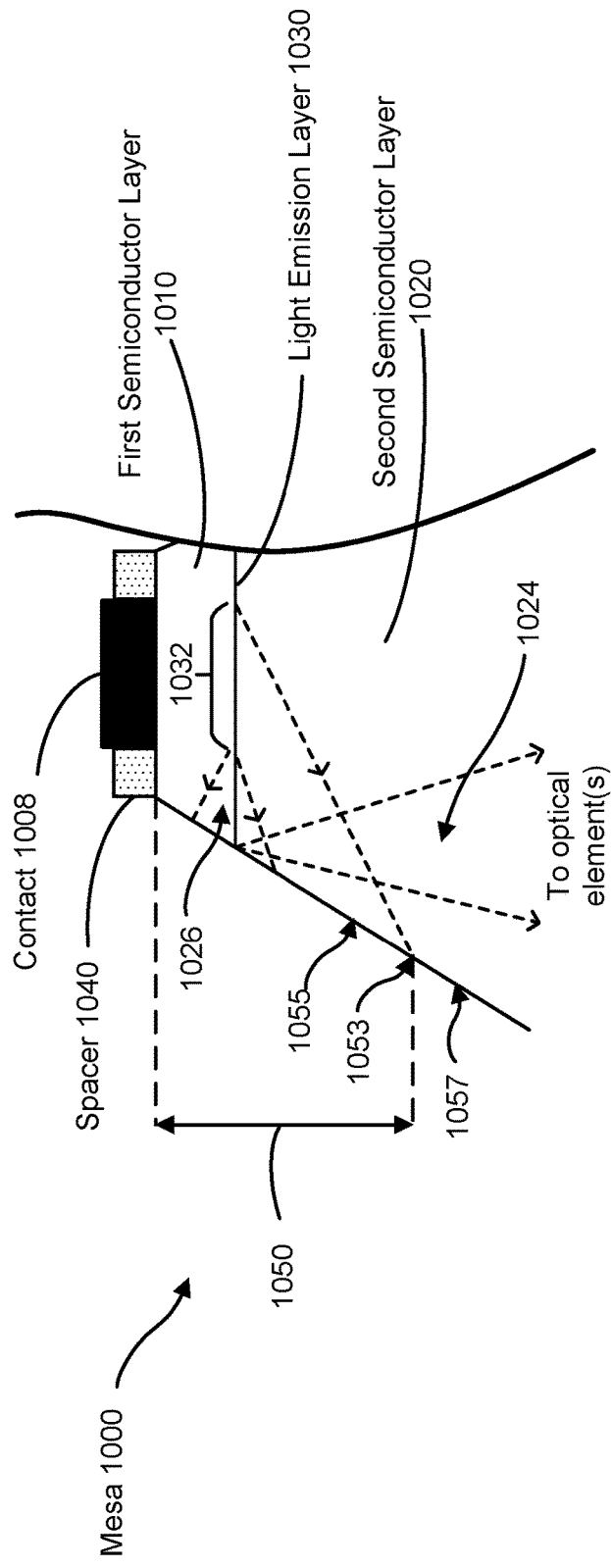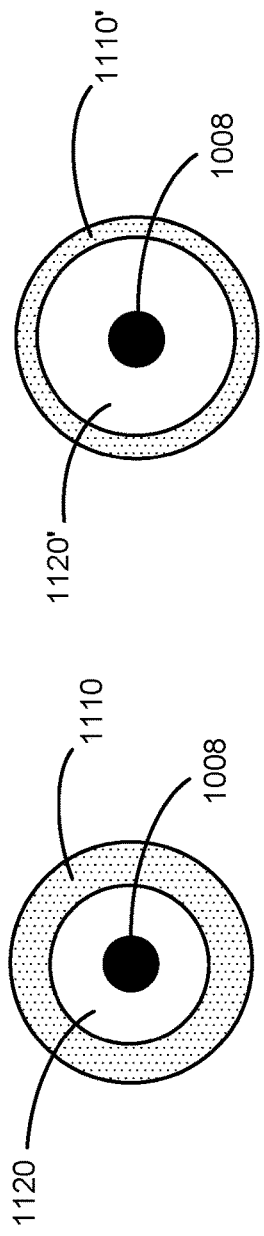

SPACER FOR SELF-ALIGNED MESA

BACKGROUND

Light emitting diodes (LEDs) convert electrical energy into optical energy and offer many benefits over other light sources, such as reduced size, improved durability, and increased energy efficiency. LEDs can be used as light sources in many display systems, such as televisions, computer monitors, laptop computers, tablets, smartphones, and wearable electronic devices. An LED usually comprises multiple semiconductor layers that are patterned using photolithography to define the overall shape of the LED. The photolithographic process involves applying a layer of photoresist and patterning the photoresist to form a mask containing openings corresponding to areas to be etched. The patterning of the photoresist usually involves precisely aligning a mask template to one or more reference points, for example, a particular feature on the semiconductor device being shaped. If the template is misaligned with respect to a reference point, the resulting LED will also be misaligned. For example, if the reference point is an electrical contact that is supposed to centered within the LED, the contact may instead be off-centered on the resulting LED, resulting in decreased optical performance.

SUMMARY

This disclosure relates generally to techniques for fabricating an LED such that various features of the LED are self-aligned during the fabrication process. In certain embodiments, the fabrication process includes a step of etching semiconductor layers to form a mesa structure, with an electrical contact that is substantially centered at the top of the mesa as a result of the self-alignment. To create the self-alignment, a spacer can be formed around the electrical contact and, in turn, the mesa can be formed around the spacer. In particular, the spacer can operate as a hard mask around which underlying semiconductor layers are etched to form the mesa. Because the spacer is formed around the electrical contact, the spacer is inherently aligned with respect to the electrical contact. Therefore, the areas that are etched to form the mesa will also be aligned with respect to the electrical contact. This avoids having to use an additional photolithography step for defining the shape of the mesa, and the potential for misalignment which goes along with photolithography.

Although the example techniques are described herein in connection with alignment to an electrical contact, the techniques can be applied for aligning to any feature of an LED. Other modifications to the LED structures or processing steps described herein will be apparent to one of ordinary skill in the art in view of the present disclosure.

According to certain embodiments, an apparatus for emitting light includes a plurality of semiconductor layers. The plurality of semiconductor layers forms a mesa with sidewalls and includes a first semiconductor layer, a second semiconductor layer, and a light emission layer between the first semiconductor layer and the second semiconductor layer. The apparatus further includes an electrical contact and a spacer. The electrical contact is formed on a surface of the first semiconductor layer and is substantially centered between opposing sidewalls of the mesa. The spacer is formed on the surface of the first semiconductor layer, around the electrical contact. The sidewalls of the mesa extend from an outer edge of the spacer.

According to certain embodiments, a method for manufacturing a light emitting apparatus includes forming a plurality of semiconductor layers, the plurality of semiconductor layers including a first semiconductor layer, a second semiconductor layer, and a light emission layer between the first semiconductor layer and the second semiconductor layer. The method further includes forming an electrical contact on a surface of the first semiconductor layer, and forming a spacer on the surface of the first semiconductor layer, around the electrical contact. The method further includes, after forming the spacer, etching the plurality of semiconductor layers to form a mesa with sidewalls that extend from an outer edge of the spacer. The spacer operates as an etch mask that causes the electrical contact to be substantially centered between opposing sidewalls of the mesa.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIGS. 2-9 illustrate various stages in a process for fabricating an LED according to certain embodiments.

FIG. 10 illustrates an example of how light emitted by an LED can be collected by one or more optical elements.

FIGS. 11A-B illustrates areas where less light emitted by an LED is collected.

Figure 1A:
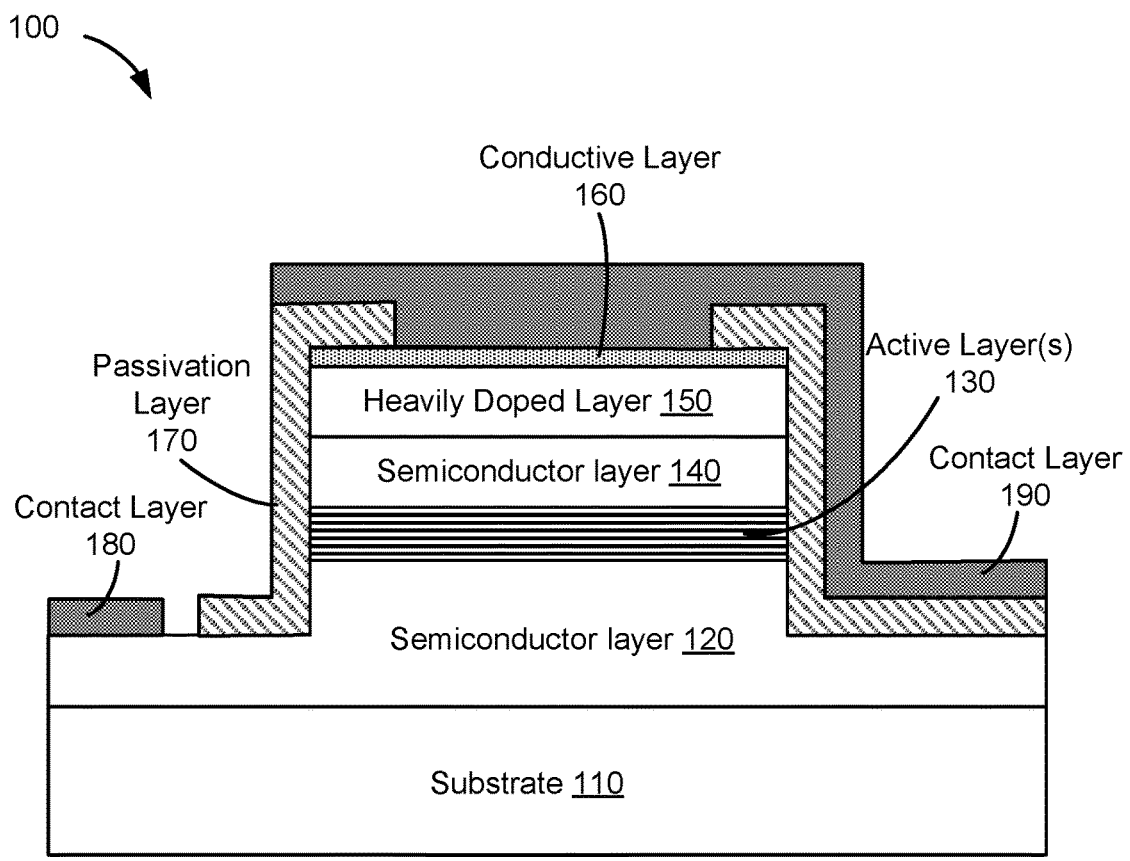
FIG. 1A illustrates an example of a light emitting diode (LED) having a vertical mesa structure according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to techniques for fabricating an LED such that various features of the LED are self-aligned during the fabrication process. In certain embodiments, the fabrication process includes a step of etching semiconductor layers to form a mesa structure, with an electrical contact that is substantially centered at the top of the mesa as a result of the self-alignment. To create the self-alignment, a spacer can be formed around the electrical contact and, in turn, the mesa can be formed around the spacer. In particular, the spacer can operate as a hard mask around which underlying semiconductor layers are etched to form the mesa. Because the spacer is formed around the electrical contact, the spacer is inherently aligned with respect to the electrical contact. Therefore, the areas that are etched to form the mesa will also be aligned with respect to the electrical contact. This avoids having to use an additional photolithography step for defining the shape of the mesa, and the potential for misalignment which goes along with photolithography.

Although the example techniques are described herein in connection with alignment to an electrical contact, the techniques can be applied for aligning to any feature of an LED. Other modifications to the LED structures or processing steps described herein will be apparent to one of ordinary skill in the art in view of the present disclosure.

The example LED structures described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1A is a cross-sectional view of an example light emitting diode 100 including a vertical mesa structure. The LED 100 is representative of an LED structure that can benefit from the fabrication techniques described herein. Reference to various features of the LED 100 will be made in the discussion of FIGS. 2-9 below. The LED 100 can be formed using inorganic materials, such as semiconductor materials. In certain embodiments, the LED 100 may include one or more layers of III-V semiconductor materials. A III-V semiconductor material may include one or more elements from Group III of the periodic table, such as aluminum (Al), gallium (Ga), or indium (In), in combination with a Group V element, such as nitrogen (N), phosphorus (P), arsenic (As), or antimony (Sb). When the Group V element of the III-V semiconductor material is nitrogen, the III-V semiconductor material is referred to as a III-nitride material. The layers can be formed by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers may be grown one layer at a time on a substrate having a certain crystal lattice orientation. The substrate could be, for example, a sapphire, quartz, GaN, GaAs, GaP, or silicon substrate cut in a specific direction to expose a specific crystallographic plane as the growth surface.

In the example shown in FIG. 1A, LED 100 includes a substrate 110, which may be formed, for example, using sapphire or GaN. A semiconductor layer 120 may be grown on substrate 110. Semiconductor layer 120 may include a III-V material, such as GaN, and may be p-doped (e.g., with Mg, Ca, Zn, or Be) or n-doped (e.g., with Si or Ge). In turn, one or more active layers 130 may be grown on semiconductor layer 120. Active layers 130 may include one or more InGaN layers, one or more AlInGaP layers, or one or more GaN layers, which may form one or more heterostructures, such as one or more quantum wells. A semiconductor layer 140 may be grown on active layers 130. Semiconductor layer 140 may include a III-V material, such as GaN, and may be p-doped (e.g., with Mg, Ca, Zn, or Be) or n-doped (e.g., with Si or Ge). One of semiconductor layer 120 and semiconductor layer 140 may be a p-type layer and the other one may be an n-type layer. That is, the semiconductor layers 120 and 140 can be oppositely doped. The active layers 130 are interposed between the semiconductor layer 120 and the semiconductor layer 140. For example, LED 100 may include a layer of InGaN (e.g., active layer 130) situated between a layer of p-type GaN doped with magnesium (e.g., layer 120) and a layer of n-type GaN doped with silicon or oxygen (e.g., layer 140). In some embodiments, LED 100 may include a layer of AlInGaP situated between a layer of p-type AlInGaP doped with zinc or magnesium and a layer of n-type AlInGaP doped with selenium, silicon, or tellurium. The substrate may have a certain crystal lattice structure (e.g., cubic body centered, cubic face centered, or hexagonal). Semiconductor layers that are grown on top of the substrate 110, such as the semiconductor layers 120, 140 and the active layer 130, tend to have crystal lattice structures that are similar to or match that of the substrate 110.

In some embodiments, an electron-blocking layer (EBL) (not shown) may be grown to form a layer between active layers 130 and at least one of semiconductor layer 120 or semiconductor layer 140. The EBL may reduce leakage current and improve the efficiency of the LED. In some embodiments, a heavily-doped semiconductor layer 150, such as a $P^+$ or $P^{++}$ semiconductor layer, may be formed on semiconductor layer 140 and act as a contact layer for forming an ohmic contact and reducing the contact impedance of the device. A conductive layer 160 may be formed on heavily-doped semiconductor layer 150. In embodiments where heavily-doped semiconductor layer 150 is omitted, the conductive layer 160 can be formed directly on semiconductor layer 140. Conductive layer 160 may include, for example, an indium tin oxide (ITO) or Al/Ni/Au film. In one example, conductive layer 160 may include a transparent ITO layer.

To make electrical contact with semiconductor layer 120 and to more efficiently extract light emitted by active layers 130, the semiconductor material layers may be etched to expose semiconductor layer 120 and to form a mesa structure that includes the layers 120-160. The mesa structure may confine carriers within the injection area of the device. Depending on how the mesa structure is etched, the resulting mesa may or may not have surfaces that are orthogonal to the growth planes. For example, if the mesa is formed as a rectangular mesa with vertical sidewalls, the sidewalls can be non-polar (e.g., the (10$\bar{1}$0) m-plane of a III-nitride semiconductor material with a hexagonal crystal lattice structure) while the horizontal areas of semiconductor layer 120 around the bottom of the sidewalls are polar (e.g., the (0001) c-plane). Alternatively, if the mesa is trapezoidal, the straight sidewalls can be semi-polar (e.g., the (20$\bar{2}$1) plane). Similarly, if the mesa is domed or parabolic, the curved sidewalls can be semi-polar to different degrees. Thus, conductive layer 160 may contact one or more types of planes (e.g., c-plane, non-polar, and/or semi-polar) depending on the shape of the mesa. Different planes can have different performance characteristics (e.g., higher or lower contact resistance).

A passivation layer 170 may be formed on the sidewalls of the mesa structure. Passivation layer 170 may include an oxide layer, such as an $SiO_2$ layer. The passivation layer 170 may act as a light reflector that prevents a certain amount of emitted light from escaping out the sides of the mesa. In some embodiments, passivation layer 170 may include a metal layer, such as a layer of aluminum (Al) or silver (Ag), that is light reflective. A contact layer 180 can be formed of a metal such as Al, Au, Ni, Ti, or any combination thereof, and may be formed on semiconductor layer 120 to act as an electrode of LED 100. In some embodiments, the contact layer 180 can be formed of a conductive oxide. In addition, another contact layer 190, such as an Al/Ni/Au metal layer or conductive oxide, may be formed on conductive layer 160 to act as another electrode of LED 100.

When a voltage signal is applied across contact layers 180 and 190, electrons and holes may recombine in active layers 130, where the recombination of electrons and holes may cause photon emission. The wavelength and energy of the emitted photons depends on the energy bandgap between the valence band and the conduction band in active layers 130, which varies based on what materials are used for the active layers 130. For example, InGaN active layers may emit green or blue light, while AlInGaP active layers may emit red, orange, yellow, or green light. The emitted photons can be reflected by passivation layer 170 and may exit LED 100 from the top (e.g., the conductive layer 160 and contact layer 190) or bottom (e.g., the substrate 110).

In some embodiments, LED 100 may include additional, fewer, or different components. For example, LED 100 could include a lens on a light emission surface, such as substrate 110, to focus or collimate the emitted light or to couple the emitted light into a waveguide. Although FIG. 1A depicts the mesa as rectangular, in some embodiments, an LED may include a mesa of another shape, such as a planar, conical, semi-parabolic, or parabolic shape, where a base area of the mesa may be circular, rectangular, hexagonal, or triangular. For example, a mesa can have curved sidewalls (e.g., a parabolic shape) and a flat top. The mesa may be truncated or non-truncated. For example, a conical mesa that has been truncated so that a top portion of the cone is missing can still be substantially conical in shape.

Figure 1B:
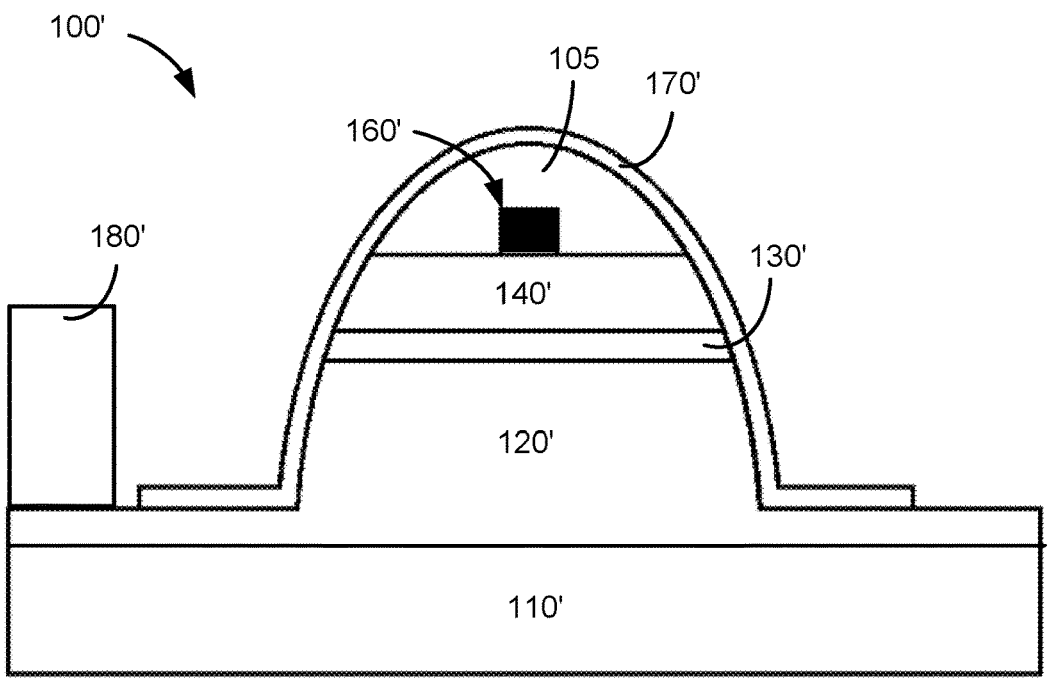
FIG. 1B is a cross-sectional view of an example of an LED having a parabolic mesa structure according to certain embodiments.

FIG. 1B is a cross-sectional view of an example of an LED 100' having a parabolic mesa structure. Similar to LED 100, LED 100' may include multiple layers of semiconductor materials, such as multiple layers of III-V semiconductor materials. The semiconductor material layers may be epitaxially grown on a substrate 110', such as a GaN substrate or a sapphire substrate. For example, a semiconductor layer 120' may be grown on substrate 110'. Semiconductor layer 120' may include a III-V material, such as GaN, and may be p-doped (e.g., with Mg, Ca, Zn, or Be) or n-doped (e.g., with Si or Ge). One or more active layers 130' may be grown on semiconductor layer 120'. Active layers 130' may include one or more InGaN layers, one or more AlInGaP layers, or one or more GaN layers, which may form one or more heterostructures, such as one or more quantum wells. A semiconductor layer 140' may be grown on active layers 130'. Semiconductor layer 140' may include a III-V material, such as GaN, and may be p-doped (e.g., with Mg, Ca, Zn, or Be) or n-doped (e.g., with Si or Ge). One of semiconductor layer 120' and semiconductor layer 140' may be a p-type layer and the other one may be an n-type layer.

As shown in FIG. 1B, LED 100' may have a mesa that includes a dome top composed of a substantially transparent material 105, such as an oxide or a silicon compound (e.g., silicon oxide (SiOx) or silicon nitride (SiNx)). In some embodiments, transparent material 105 may include a material having a refractive index similar to that of semiconductor layer 140'. A reflector 170' may be formed on top of transparent material 105. In some embodiments, reflector 170' may include multiple layers of dielectric materials. In some embodiments, reflector 170' may include a metal layer, such as a layer of aluminum (Al) or silver (Ag). Reflector 170' may reflect light emitted by active layers 130' toward substrate 110'. In some embodiments, reflector 170' may be parabolic-shaped to act as a parabolic reflector.

Electrical contact 160' and electrical contact 180' may be formed on semiconductor layer 140' and semiconductor layer 120', respectively. Electrical contact 160' and electrical contact 180' may each include a conductive material, such as Al, Au, Ni, Ti, or any combination thereof, and may act as the electrodes of LED 100'. When a voltage signal is applied across electrical contacts 160' and 180', electrons and holes in active layers 130' may recombine, where the recombination of electrons and holes may be accompanied by photon emission. The emitted photons may propagate in many different directions, and may be reflected by reflector 170' towards substrate 110' and exit LED 100'. One or more other optical components, such as a lens, may be formed on the light emission surface, such as substrate 110', to focus or collimate the emitted light or couple the emitted light into a waveguide.

FIGS. 2-9 illustrate various stages in a process for fabricating an LED according to certain embodiments. The stages illustrated in FIGS. 2-9 are presented in sequence. However, alternative sequences and process steps are possible. The process illustrated in FIGS. 2-9 produces an LED structure having a particular configuration, but the process can be applied and/or adapted to other LED structures. Where applicable, reference is made to corresponding features of the LED 100 in FIG. 1A.

FIG. 2 shows a cross-sectional view of a layered semiconductor device 200 being fabricated into an LED. In particular, the semiconductor device 200 can, as illustrated in FIGS. 2-9, be fabricated into a structure with elements corresponding to those of the LED 100 in FIG. 1A. The semiconductor device 200 includes a plurality of semiconductor layers 202. The individual layers are omitted for simplicity, but can include, for example, a first semiconductor layer and a second semiconductor layer. The first and second semiconductor layers can be oppositely doped (i.e., one p-type layer and one n-type layer) and can correspond to the semiconductor layers 120 and 140 in FIG. 1A. The semiconductor layers 202 can further include a light emission layer corresponding to the active layer 130. The light emission layer may include one or more quantum wells. The semiconductor layers 202 can be formed (e.g., epitaxially grown) on a substrate 204 corresponding to substrate 110. A contact 208 is formed on an outermost layer of the semiconductor layers 202 and corresponds to conductive layer 160.

FIG. 3 shows a dielectric layer 310 formed over the semiconductor layers 202 and the contact 208. The dielectric layer 310 may include any suitable dielectric material such as, for example, silicon dioxide ($SiO_2$) or silicon oxide (SiOx), and can be formed using conformal deposition of the dielectric material. As shown in FIG. 3, the dielectric layer 310 completely covers the contact 208 and the outer surface of the semiconductor layers 202. The dielectric layer 310 is converted into a spacer around the contact 208 by etching the dielectric layer 310. For example, the dielectric layer 310 can be etched using Radio Frequency (RF) oxygen plasma etching or inductively coupled plasma (ICP) etching.

Figure 4:
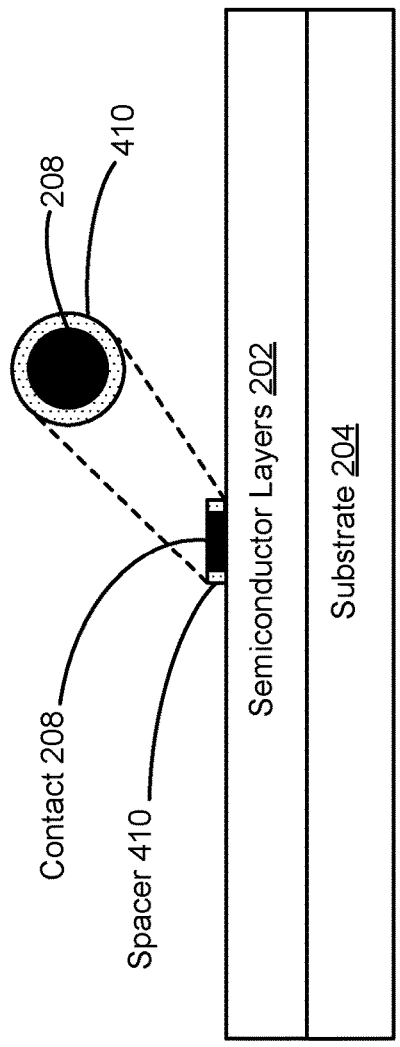

FIG. 4 shows a result of etching the dielectric layer 310 to form a spacer 410. The inset image is a top view of the contact 208 and spacer 410. The etching process removes most of the dielectric layer 310, leaving a small amount of dielectric around the contact 208. The contact 208 itself is not etched to any significant degree because the contact 208 comprises an electrically conductive material that is substantially impervious to the etching agent or agents (e.g., one or more plasmas) which target the dielectric layer 310. For example, the contact 208 may be a metal. As shown in the inset, the contact 208 is circular and the spacer 410 forms an annular ring around the perimeter of the contact 208. The spacer 410 has a substantially uniform thickness and is concentric with the contact 208. In practice, however, the spacer 410 may not be perfectly uniform due to slight variations in the geometry of the contact 208, the amount of dielectric deposited around the contact 208, or other factors.

Figure 5:
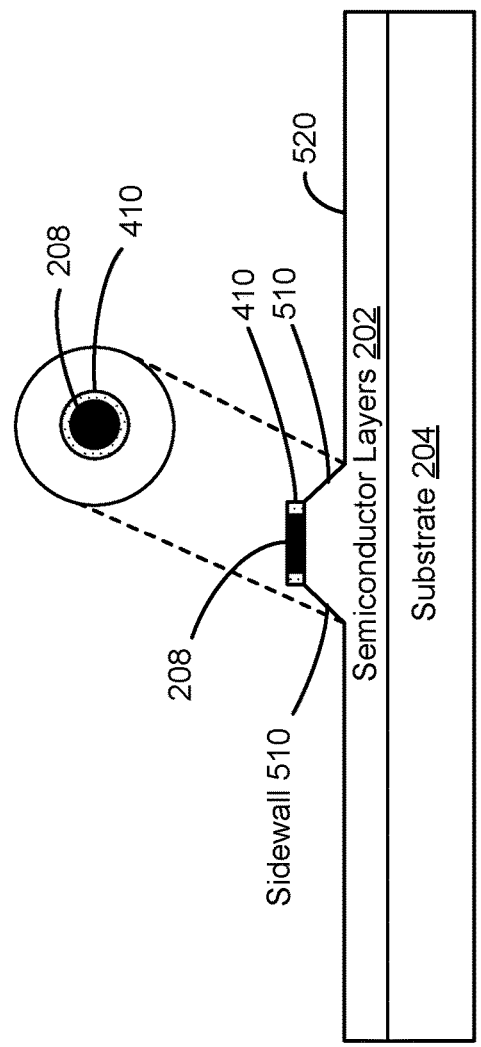

FIG. 5 shows a result of etching the semiconductor layers 202 to form a mesa. In the example of FIG. 5, the mesa has sloped sidewalls 510, unlike the vertical sidewalls in the LED 100. However, vertical sidewalls or other sidewall profiles can be achieved through appropriate control over the etching conditions which form the mesa. The sidewalls 510 can be formed, for example, by etching at a forty five degree angle. When viewed in three dimensions, the mesa of FIG. 5 may be substantially conical, where the top of the cone is flat as a result of forming the mesa by etching around the bottom of the spacer 410. Similar to how the contact 208 is substantially impervious to the etching agent or agents used to form the spacer 410, the spacer 410 is substantially impervious to the etching agent or agents used to form the mesa. The spacer 410 therefore operates as a hard mask that defines the shape of the mesa. During the mesa etch, the semiconductor layers 202 are eroded such the sidewalls 510 extend away from the outer edge of the spacer 410. Because the mesa is formed around the spacer 410, the mesa is inherently aligned with respect to the contact 208. In particular, the contact 208 can be substantially centered between opposing sidewalls 510 so that the contact 208, the spacer 410, and the mesa appear as concentric circles when viewed from a top down perspective, shown in the inset image. The width of the spacer 410 corresponds to the distance between the top edge of the mesa and the contact 208. The spacer width can vary depending on the electrical properties of the semiconductor material, in particular the distance which current can travel down the sidewalls of the mesa. Appropriate selection of the spacer width prevents such leakage current so that the current is confined to flowing between the contact 208 and the quantum well(s) inside the semiconductor layer 202. Generally, AlInGaP requires a larger spacer width than GaN.

The semiconductor layers 202 are etched to a particular depth corresponding to the base of the mesa. The base of the mesa extends from a flat portion 520 of the semiconductor layers 202. The flat portion 520 may correspond to a single layer, such as the semiconductor layer 120 in FIG. 1A. Thus, while the mesa itself may include all of the semiconductor layers 202, the area beneath the base of the mesa may only include one semiconductor layer.

Figure 6:
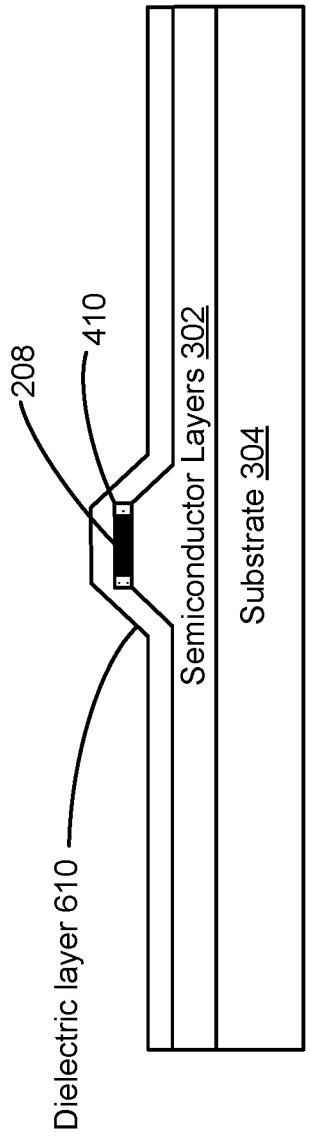

FIG. 6 shows a dielectric layer 610 formed over the semiconductor device. The dielectric layer 610 can be formed in a similar manner to the dielectric layer 310 to cover the contact 208, the spacer 410, and the semiconductor layers 302. The dielectric layer 610 operates as a passivation layer analogous to the passivation layer 170 of FIG. 1A. Although both the layers 310 and 610 are formed of a dielectric material, the layers 310 and 610 are not necessarily formed of the same dielectric.

Figure 7:
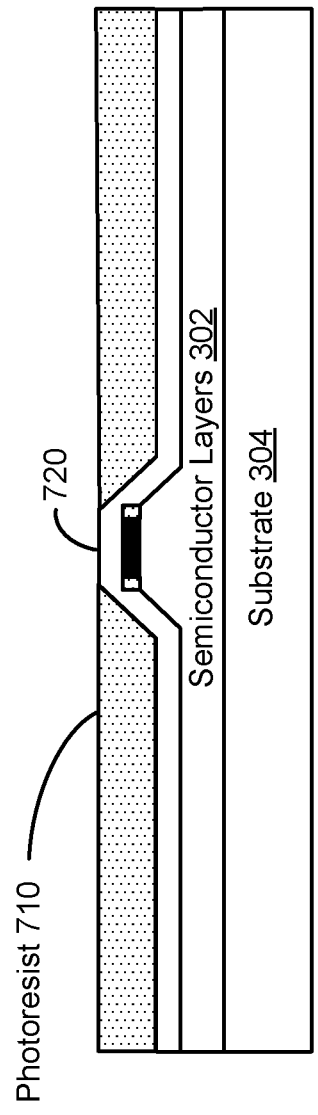
Figure 8:
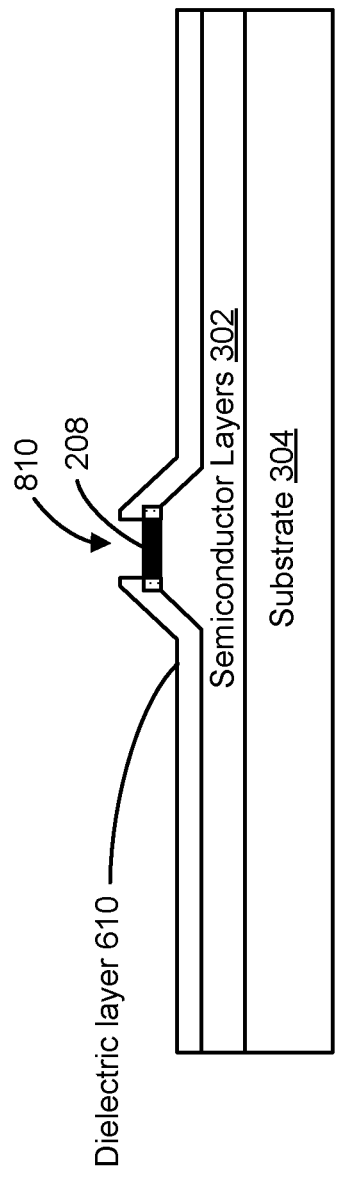

FIG. 7 shows a result of applying a coating of photoresist 710 onto the dielectric layer 610 and etching the photoresist 710 to expose a top portion 720 of the dielectric layer 610. In turn, the dielectric layer 610 can be etched to define an opening 810 within the top portion 720 to expose the contact 208, as shown in FIG. 8. The photoresist 710 is removed after the opening is formed.

Figure 9:
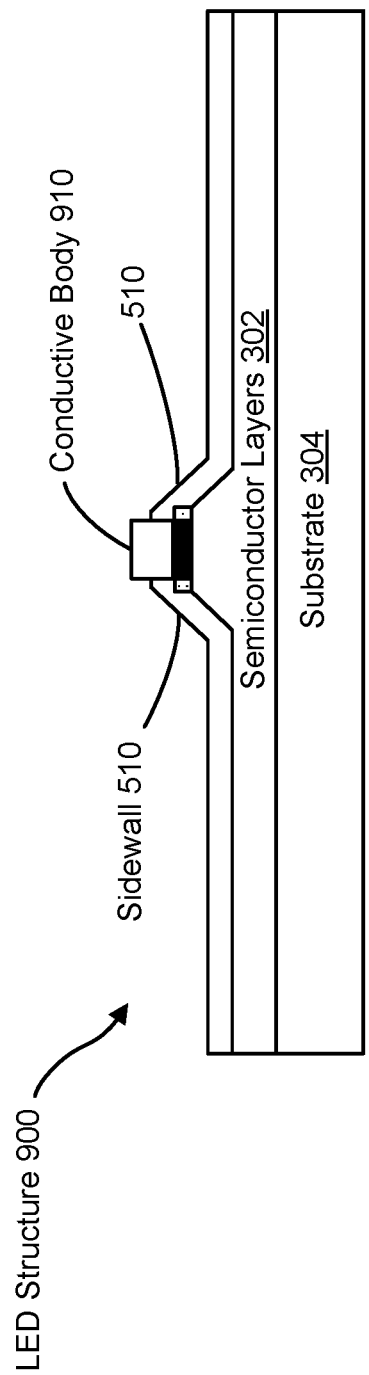

FIG. 9 shows a conductive body 910 formed to fill the opening 810, resulting in an LED structure 900 that corresponds to a substantially complete LED, minus certain elements such as another conductive body (e.g., contact layer 180 in FIG. 1A) that is paired with the conductive body 910 to establish a current path for receiving an electrical signal that drives the LED. The conductive body 910 is formed on the exposed surface of the contact 208 and corresponds to the contact layer 190 in FIG. 1A. The conductive body 910 can form an interconnect to a driver circuit (not shown) that supplies the electrical signal for driving the LED. The LED structure 900 can be replicated to form multiple LED structures 900 at the same time and on the same substrate 304. For instance, multiple LED structures 900 of substantially the same height can be bump bonded to corresponding interconnects on a driver circuit that applies voltage signals for individually driving each LED. The driver circuit can be attached, for example, by stacking the driver circuit on top of the LED structures 900 with solder bumps placed between the contacts of the driver circuit and the contacts (e.g., conductive body 910) of each LED structure, and then reflowing the solder bumps.

In certain embodiments an LED device may include one or more optical elements, such as one or more lenses to focus or collimate the emitted light or to couple the emitted light into a waveguide. The locations of these optical elements can vary, but at least some of the optical elements may be located within the LED structure 900 itself. For example, a lens can be formed on a surface of the substrate 304 or embedded within the substrate 304, and may couple the emitted light to a waveguide that is embedded within or attached to the substrate 304. To facilitate the collection of light by these optical elements, one or more surfaces of the LED structure 900 can be made of a reflective material so that at least a portion of the emitted light is reflected into the optical elements instead of being transmitted through the sidewalls 510. For example, in certain embodiments, the conductive body 910 may extend over a larger area than depicted in FIG. 9, e.g., to cover a portion of the sidewalls 510 in a manner similar to that of the contact layer 190 in FIG. 1A. In addition to the use of reflective materials, the shape of the mesa can influence how much light is collected. For instance, as described below in connection with FIGS. 10 and 11A-B, the depth of the mesa etch, and thus the overall height of the mesa, can be a contributing factor to the amount light that reaches the optical elements.

FIG. 10 is partial cross-sectional view of a mesa 1000 on which a contact 1008 and a spacer 1040 are formed. The mesa 1000 can be formed using the processing steps described in connection with FIGS. 2-9. The height of the spacer 1040 is depicted as being slightly lower than the height of the contact 1008 to indicate that the etching process which forms the spacer 1040 (e.g., as described in connection with FIGS. 3 and 4) may not necessarily produce a spacer that is completely flush with the contact. As shown in FIG. 10, the mesa 1000 includes a first semiconductor layer 1010, a light emission layer 1030, and a second semiconductor layer 1020. For simplicity, the light emission layer 1030 is represented as a thin line, but the light emission layer 1030 can have a certain thickness, similar to the active layer(s) 130 in FIG. 1A.

Light is generated within an emission area 1032 of the light emission layer 1030 corresponding to the contact 1008. The light is generally emitted in all directions, with some of the light reaching the sidewalls of the mesa. FIG. 10 shows light traveling from both ends of the emission area 1032 to the left sidewall of the mesa 1000. If the sidewall is at a forty five degree angle, light reaching the sidewall will bounce down at forty five degrees. There is a certain acceptance angle that defines a cone shaped region 1024 within which light reflected from the sidewall (e.g., light reflected by a passivation layer that coats the sidewall) will reach the optical element(s) of the LED. The acceptance angle depends on the index of refraction of the layer(s) through which the light travels to reach the optical elements. For example, if the second semiconductor layer 1020 is GaN, the acceptance angle may be plus or minus approximately four degrees. Similarly, there is a cone shaped region 1026 within which light traveling from a particular point along the emission area 1032 will reach the sidewalls and be reflected into the region 1024, and thus be collected by the optical elements.

FIG. 10 shows the region 1026 for the leftmost end of the emission area 1032. The acceptance angle remains the same along the entire length of the emission area 1032. However, as the emission point moves farther away from the sidewall, a larger window of the sidewall will receive the emitted light. Assuming that light from the right end of the emission area 1032 needs to reach a point 1053 along the left sidewall in order to be collected by the optical elements, then the mesa 1000 needs to be etched to a depth 1050 corresponding to the point 1053. That is, the base of the mesa would need to be at point 1053 or lower. If the base were higher than point 1053, for example, at a point 1055, then the light from the right end of the emission area 1032 would not be collected by the optical elements. If the base were lower than point 1053, for example, at point 1057, then the light from the right end of the emission area 1032 would be collected, but there would be no additional benefit to going lower than point 1053. However, because of variations in process conditions, the height of the mesa may not be completely uniform around the mesa. Some portions of the mesa may be slightly higher or lower than other portions.

To compensate for variation in mesa height, in certain embodiments, the semiconductor layers are etched until a base of the mesa is located beyond a point at which emitted light reflected from the sidewalls is no longer collected by the one or more optical elements. For example, the mesa could be etched past point 1053 to point 1057, where point 1057 is selected taking into consideration that the actual base of the mesa may vary within a certain range of point 1057, and where the highest possible point for the actual base of the mesa is still below the point 1053. In this manner, the amount of light collected is maximized and substantially uniform around the entire perimeter of the mesa 1000. Accordingly, there is a process window that allows for variations in the depth of the etch around the point 1057. So long as the actual etch depth is within the range of values associated with this process window, the light output will be substantially the same despite variation in etch depth from one LED structure to another.

FIG. 11A is a top view of an area 1110 within a mesa where less light is collected. The area 1110 may correspond to an area produced as a result of etching to a depth above the point 1053 in FIG. 10, e.g., so that the base of the mesa begins at point 1055. In FIG. 11A, although the base of the mesa begins above the point 1053, some amount of light will still reach the area below point 1053. For instance, light will impinge on the area of the second semiconductor layer 1020 around point 1057, but will not extract into an angle needed for the light to enter the one or more optical elements. The area is ring shaped and substantially uniform in width as a result of the conical shape of the mesa. Within the area 1110 is an area 1120 around contact 1008 in which light is collected.

FIG. 11B is a top view of an area 1110' within a mesa where less light is collected. The area 1110' is a smaller ring compared to area 1110 in FIG. 11A. This may be a result of etching to at least the point 1053 in FIG. 10. Because the area 1110' is smaller, an area 1120' within which light is collected is correspondingly larger than in FIG. 11A.

Figure 12:
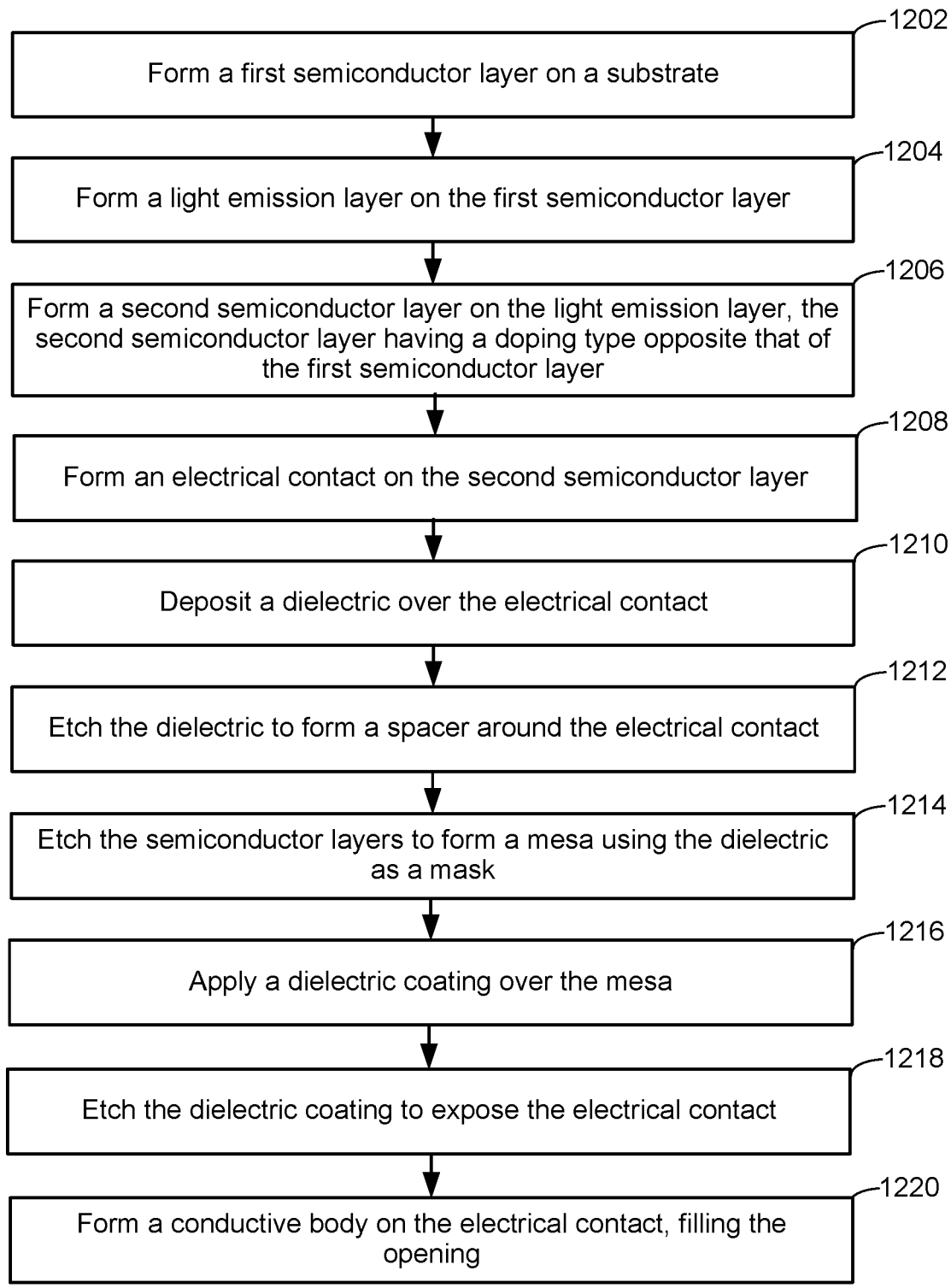
FIG. 12 is a flow chart of an example method for fabricating an LED device according to certain embodiments.

FIG. 12 is a flow chart illustrating an example of a method 1200 of fabricating an LED device according to certain embodiments. The method 1200 can, in certain embodiments, be performed in software, for example, as computer-readable instructions stored on a non-transitory computer-readable medium, where the instructions are executable by one or more processors of a computer system controlling semiconductor manufacturing equipment. The operations described in FIG. 12 may be performed by one or more semiconductor fabrication systems that include, for example, molecular beam epitaxy (MBE) or metalorganic chemical vapor deposition (MOCVD) equipment. The operations described in FIG. 12 are for illustration purposes only and are not intended to be limiting. In various implementations, modifications may be made to method 1200 to add additional operations or to omit some operations.

At step 1202, a first semiconductor layer (e.g., corresponding to semiconductor layer 120 in FIG. 1) is formed on a substrate, such as a sapphire substrate or a bulk III-V semiconductor substrate (e.g., a GaN substrate). The substrate may be cut along a certain crystal growth plane, for example, a semi-polar plane or a c-plane, to expose a corresponding facet. The first semiconductor layer may be epitaxially grown and can be formed directly on a surface (e.g., the exposed facet) of the substrate, in which case the first semiconductor layer may have the same or a similar crystal lattice structure as the surface of the substrate. Alternatively, in some embodiments, a buffer layer may be introduced between the substrate and the first semiconductor layer to accommodate differences between the crystal structures of the first semiconductor layer and the substrate. The first semiconductor layer can be an III-V material (e.g., a III-nitride) and may be doped with a certain dopant type (e.g., n-type).

At step 1204, an light emission layer is formed on the first semiconductor layer. The light emission layer can include one or more active layers, at least one of which is a quantum well. Depending on the color of light to be emitted by the LED being formed, various materials can be incorporated into the light emission layer. For example, to generate green or blue light, a compound comprising nitrogen in combination with one or more of indium, gallium, or aluminum can be used (e.g., InGaN or GaN). In some embodiments, the light emission layer can include multiple quantum wells.

As step 1206, a second semiconductor layer (e.g., corresponding to semiconductor layer 140 in FIG. 1A) is formed on the light emission layer. The second semiconductor layer can be a III-V material with a doping type opposite that of the first semiconductor layer. For example, the first semiconductor layer and the second semiconductor layer can both be formed of the same III-nitride material (e.g., GaN), but with one of the semiconductor layers being n-type and the other semiconductor layer being p-type.

At step 1208, an electrical contact is formed on the second semiconductor layer. The electrical contact can be formed of any suitable conductive material including, for example, a conductive oxide or a metal, where the oxide/metal forms an ohmic contact to the second semiconductor layer.

At step 1210, a dielectric is deposited over the electrical contact. The dielectric can be applied over the exposed surfaces of the electrical contact and the second semiconductor layer, using conformal deposition. The resulting structure may be similar to that depicted in FIG. 3.

At step 1212, the dielectric deposited in step 1210 is etched to form a spacer around the electrical contact. The spacer can form a ring around the electrical contact, for example, as shown in FIG. 4, and may completely surround the sides of the electrical contact, leaving only the top surface of the electrical contact exposed. However, as shown in the example of FIG. 10, there may be a slight difference in height between the spacer and the electrical contact.

At step 1214, the semiconductor layers, including the first semiconductor layer, the second semiconductor layer, and the light emission layer, are etched to form a mesa. The spacer operates as a hard mask during the mesa etch. Because the mesa is formed around the spacer, and because the spacer is formed around the electrical contact, the mesa will be aligned with respect to the electrical contact. In particular, the electrical contact may be substantially centered between opposing sidewalls of the mesa. The etching can be such that the base of the resulting mesa extends from the first semiconductor layer. Further, as discussed in connection with FIG. 10, the mesa can be etched until a base of the mesa is located beyond a point at which emitted light reflected from the sidewalls is no longer collected by one or more optical elements. The formation of the optical elements is not covered in FIG. 12, but can occur at various times. For example, the optical elements may be formed in a separate process and attached to the substrate after the method 1200 is completed. As another example, one or more optical elements may be formed on a surface of the substrate before forming the first semiconductor layer in step 1202.

At step 1216, a dielectric coating is applied over the mesa to cover the spacer, the electrical contact, and the second semiconductor layer. The dielectric coating can be applied using conformal deposition, similar to the dielectric deposition in step 1210. The dielectric coating acts as a passivation layer and may comprise, for example, $SiO_2$, $SiN_x$, or $Al_2O_3$. The dielectric coating may include a reflective layer, such as a layer of aluminum or silver. In some embodiments, the dielectric material of the dielectric coating may operate as a reflector, e.g., a dielectric mirror comprising a stack of dielectric layers with different indices of refraction. Therefore, the dielectric coating can be formed over one or more deposition steps.

At step 1218, the dielectric coating is etched to expose the electrical contact. The etching of the dielectric coating can be performed in a similar manner to the dielectric etch in step 1212, except that the etching in step 1218 may involve photolithography. In particular, a layer of photoresist (e.g., photoresist 710 in FIG. 7) may be applied over the dielectric coating and patterned to create a mask with an opening corresponding to an area of the dielectric coating to be etched away. This area is located over the electric contact and corresponds to the opening 810 in FIG. 8.

At step 1220, a conductive body is formed on the electrical contact, e.g., on the surface of the electrical contact that was exposed by the etching of the dielectric coating in step 1218. The conductive body can completely fill the opening in the dielectric coating, in a manner similar to that depicted in FIG. 9, and allows an electrical signal to be applied to the electrical contact. For example, a voltage may be applied across the electrical contact and another contact (e.g., corresponding to contact layer 180 in FIG. 1A) to drive the LED. The conductive body can, but does not have to be, formed of a different material than the electrical contact. In some embodiments, the conductive body is a reflective material that covers at least a portion of the sidewalls of the mesa in order to reflect the light emitted by the light emission layer.

Although only one mesa structure (corresponding to a single LED) is described with respect to FIG. 12, multiple mesa structures, such as a one-dimensional or two-dimensional array of mesa structures, may be formed simultaneously. For example, the etching in step 1214 can form an array of mesa structures on the same die or wafer. Similarly, the dielectric coating in 1216 may cover an array of mesa structures. Therefore, the method 1200 can be applied to simultaneously fabricate multiple LEDs.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The methods and apparatuses discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium," as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. An apparatus for emitting light, comprising:
a plurality of semiconductor layers, wherein the plurality of semiconductor layers includes a first semiconductor layer, a second semiconductor layer, and a light emission layer between the first semiconductor layer and the second semiconductor layer, and wherein the plurality of semiconductor layers forms a mesa with sidewalls;
an electrical contact formed on a surface of the first semiconductor layer, wherein the electrical contact is substantially centered between opposing sidewalls of the mesa; and
a spacer formed on the surface of the first semiconductor layer, around the electrical contact, wherein the sidewalls of the mesa extend from an outer edge of the spacer.

2. The apparatus of claim 1, wherein the spacer comprises a dielectric material.

3. The apparatus of claim 1, wherein the mesa is substantially conical.

4. The apparatus of claim 1, further comprising:
a dielectric layer covering the spacer and extending over the sidewalls of the mesa.

5. The apparatus of claim 4, further comprising:
a conductive body that fills an opening within the dielectric layer and is formed on a surface of the electrical contact.

6. The apparatus of claim 1, where the electrical contact is circular, and wherein the spacer forms an annular ring of substantially uniform thickness around the electrical contact.

7. The apparatus of claim 1, further comprising:
one or more optical elements configured to collect light emitted by the light emission layer, wherein at least some of the emitted light collected by the one or more optical elements is received through reflection off the sidewalls of the mesa, and wherein a base of the mesa is located beyond a point at which emitted light reflected off the sidewalls is no longer collected by the one or more optical elements.

8. The apparatus of claim 7, further comprising:
a reflective layer covering the sidewalls of the mesa, wherein the emitted light reflected off the sidewalls is reflected by the reflective layer.

9. An apparatus fabricated by a method comprising:
forming a plurality of semiconductor layers, wherein the plurality of semiconductor layers includes a first semiconductor layer, a second semiconductor layer, and a light emission layer between the first semiconductor layer and the second semiconductor layer;
forming an electrical contact on a surface of the first semiconductor layer;
forming a spacer on the surface of the first semiconductor layer, around the electrical contact; and
after forming the spacer, etching the plurality of semiconductor layers to form a mesa with sidewalls that extend from an outer edge of the spacer, wherein the spacer operates as an etch mask that causes the electrical contact to be substantially centered between opposing sidewalls of the mesa.

10. The apparatus of claim 9, wherein the spacer comprises a dielectric material.

11. The apparatus of claim 9, wherein:
the apparatus includes one or more optical elements configured to collect light emitted by the light emission layer;
at least some of the emitted light collected by the one or more optical elements is received through reflection off the sidewalls of the mesa; and
the plurality of semiconductor layers are etched until a base of the mesa is located beyond a point at which emitted light reflected off the sidewalls is no longer collected by the one or more optical elements.

12. The apparatus of claim 11, wherein the apparatus is further fabricated by:
forming a reflective layer covering the sidewalls of the mesa, wherein the emitted light reflected off the sidewalls is reflected by the reflective layer.

13. The apparatus of claim 9, wherein the etching of the plurality of semiconductors forms the mesa into a substantially conical shape.

14. The apparatus of claim 9, wherein the apparatus is further fabricated by:
forming a dielectric layer that covers the spacer and extends over the sidewalls of the mesa.

15. The apparatus of claim 14, wherein the apparatus is further fabricated by:
forming a conductive body that fills an opening within the dielectric layer and is located on a surface of the electrical contact.

16. The apparatus of claim 9, where the electrical contact is circular, and wherein the spacer forms an annular ring of substantially uniform thickness around the electrical contact.

* * * * *